United States Patent

Allison

[15] 3,660,732

[45] May 2, 1972

[54] SEMICONDUCTOR STRUCTURE WITH DIELECTRIC AND AIR ISOLATION AND METHOD

[72] Inventor: David Frank Allison, Los Altos, Calif.

[73] Assignee: Signetics Corporation, Sunnyvale, Calif.

[22] Filed: Feb. 8, 1971

[21] Appl. No.: 113,628

Related U.S. Application Data

[63] Continuation of Ser. No. 776,427, Nov. 18, 1968, abandoned.

[52] U.S. Cl. ....................317/234 R, 317/235 B, 317/235 D, 317/235 F, 317/235 R

[51] Int. Cl. ..........................................H01l 3/00, H01l 5/00

[58] Field of Search ................317/234, 235, 22, 22.1, 22.11, 317/22.2; 29/587; 148/175

[56] References Cited

UNITED STATES PATENTS

| | | | |
|---|---|---|---|
| 3,475,664 | 10/1969 | Devries | 317/234 |
| 3,412,295 | 11/1968 | Grebene | 317/234 |
| 3,489,961 | 1/1970 | Frescura et al. | 317/235 |
| 3,466,741 | 9/1969 | Wiesner | 317/234 X |
| 3,445,925 | 5/1969 | Lesk | 317/234 X |
| 3,423,255 | 1/1969 | Joyce | 317/234 X |
| 3,411,051 | 11/1968 | Kilby | 317/235 |
| 3,423,651 | 1/1969 | Legat et al. | 317/235 |
| 3,486,892 | 12/1969 | Rosvold | 317/234 X |
| 3,461,360 | 8/1969 | Barson et al. | 317/235 |

*Primary Examiner*—John W. Huckert
*Assistant Examiner*—Andrew J. James
*Attorney*—Flehr, Hohbach, Test, Albritton & Herbert

[57] ABSTRACT

Semiconductor structure having devices formed in a very thin layer of monocrystalline silicon with the devices being dielectrically and air isolated from each other.

7 Claims, 10 Drawing Figures

INVENTOR.
David F. Allison
BY Flehr, Hohbach, Test, Albritton & Herbert
Attorneys

SEMICONDUCTOR STRUCTURE WITH DIELECTRIC AND AIR ISOLATION AND METHOD

This is a continuation of Ser. No. 776,427 filed Nov. 18, 1968, now abandoned.

BACKGROUND OF THE INVENTION

In the past MOS type devices have been built utilizing silicon on sapphire in order to provide isolation for the components and also to make it possible to fabricate devices which have a minimum of parasitics due to junction capacitances. This type of structure, however, has a great disadvantage in that it is very difficult to form high quality silicon on a sapphire substrate which, in turn, makes it difficult to form devices having uniform characteristics. There is, therefore, a need for a new and improved semiconductor structure.

SUMMARY OF THE INVENTION AND OBJECTS

The semiconductor structure consists of a support body with a layer of insulating material disposed on at least one surface of the support body and a body of semiconductor material disposed on the layer of insulating material, the semiconductor body having a relatively precise depth. Semiconductor devices are formed in the semiconductor body by diffused regions extending through the semiconductor body to the insulating layer. The semiconductor body is also formed with moats or grooves which extend down to the layer of insulating material to air isolate one semiconductor device from another and also to dielectrically isolate one semiconductor device from another. Metallization is provided which makes contact to the active areas of the semiconductor device.

In general, it is an object of the present invention to provide a semiconductor structure in which the devices are air isolated and dielectrically isolated from each other.

Another object of the invention is to provide a semiconductor structure of the above character in which it is possible to fabricate devices having a minimum of parasitics due to junction capacitances.

Another object of the invention is to provide a method and apparatus of the above character in which it is possible to provide high quality semiconductor structures.

Another object of the invention is to provide a semiconductor structure which can be readily fabricated.

Additional objects and features of the invention will appear from the following description in which the preferred embodiments are set forth in detail in conjunction with the accompanying drawing.

DESCRIPTION OF THE PREFERRED EMBODIMENTS

The semiconductor structure incorporating the present invention is formed by taking a semiconductor body 11 formed of a suitable material such as monocrystalline silicon and then oxidizing the same to provide a layer 12 of a suitable insulating material such as silicon dioxide. Typically, the semiconductor body 11 can have a thickness ranging from 8 to 10 mils.

Figure 1:
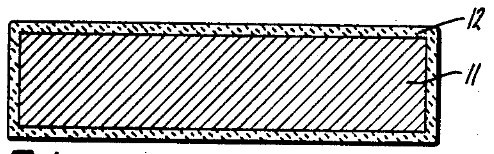
FIGS. 1–7 are cross-sectional views showing the various steps utilized in making a semiconductor structure incorporating the present invention.
Figure 2:
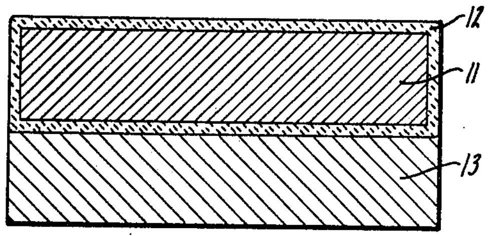
Figure 3:
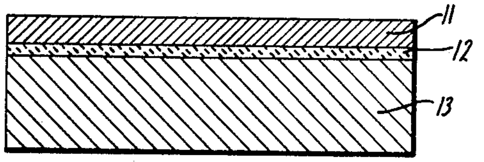
Figure 4:
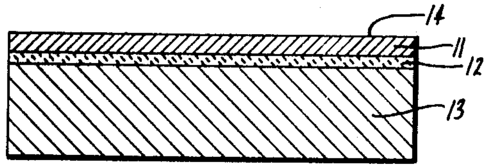

After the steps shown in FIG. 1 have been completed, a support body 13 is formed on one surface of the semiconductor body 11 so that it adheres to the insulating layer 12. The support body 13 can be formed of any suitable material and can be insulating or non-insulating. For example, it can be formed of polycrystalline silicon which may be deposited thereon in the conventional manner to a suitable thickness, such as a thickness of 8 to 10 mils. After this has been completed, the structure which is shown in FIG. 2 is placed in a lapping machine and the excess semiconductor material of the semiconductor body 11 is removed until the semiconductor body has a suitable thickness such as 5 to 8 microns. This initial removal of semiconductor material shown in FIG. 3 can be accomplished relatively rapidly by the use of a lapping machine. However, if desired, other conventional methods may be utilized for removing the semiconductor material. Thereafter, as shown in FIG. 4, the thickness of the semiconductor body 11 is still further reduced until it has a depth of 2 to 3 microns. Preferably, this is accomplished by a very slow chemical etch in order to achieve the desired control of the thickness. However, if desired, this can be accomplished by utilizing precise polishing techniques. The use of a chemical etch, however, has a desirable feature in that it makes it possible to achieve an ultra-clean surface 14 which makes it possible to fabricate high quality MOS devices as hereinafter described. As can be seen from FIG. 4, the layer 11 has a substantially uniform thickness throughout and has a surface 14 which is generally parallel to the layer 12 of insulating material.

Figure 5:
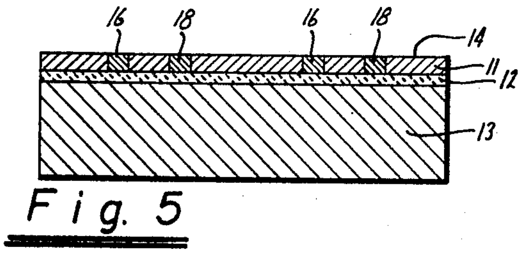

Thereafter, as shown in FIG. 5, semiconductor devices can then be formed in the semiconductor body 11 of single or monocrystalline silicon. These diffusion operations are carried out in the conventional manner. Thus, typically, an oxide layer is formed on the surface 14 and windows or openings are etched into the oxide through which the dopants are diffused to provide diffused regions 16 and 18 which extend downwardly in a generally vertical direction all the way down to the insulating layer 12. In view of the fact that the semiconductor body 11 is very thin, there is very little lateral shift of the diffusion areas 16 and 18 while they are being diffused downwardly to the insulating layer 12.

After the devices have been formed as shown in FIG. 5, they are air isolated from each other by forming moats, channels or grooves 21 in the semiconductor material 11 in between the devices so that the silicon dioxide insulating layer 12 is exposed. The moats or grooves 21 can be formed in any conventional manner, such as by a selective etch which attacks the silicon at a much faster rate than it would attack the insulating layer. Since the moats 21 extend around the devices, the devices are isolated from each other by air and, in addition, since the devices are mounted upon a layer of insulating material 12, they are dielectrically isolated by the layer of insulating material. As is well known to those skilled in the art, when the layer 12 is formed of silicon dioxide, the layer has excellent characteristics because silicon dioxide is an excellent insulator. The polycrystalline substrate 13 also can be considered as forming a part of the dielectric layer isolating the devices.

Figure 6:
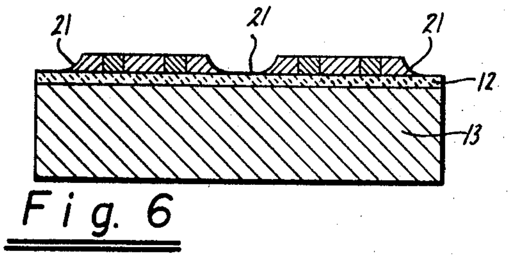

After the etching operation as shown in FIG. 6 has been completed to provide the moats 21, a layer 22 of an insulating material is formed over the devices and extends into the moats 21. This layer of insulating material can be formed in a conventional manner by placing the semiconductor structure shown in FIG. 6 in an oxidizing atmosphere. After the layer 22 has been formed, openings 26 and 27 are provided therein to make possible contact with the source and drain regions of the semiconductor device and thereafter metallization, in the form of a suitable metal such as aluminum, is evaporated thereon to provide a metal lead structure as shown in FIG. 7 which provides contacts 31, 32 and 33 for the source, the gate and the drain respectively of each of the devices as shown in FIG. 7.

Figure 7:
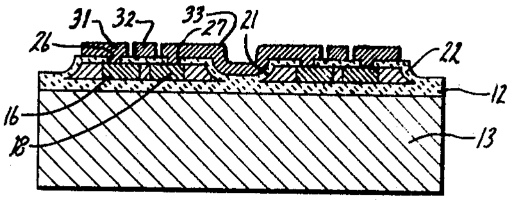

As also can be seen from FIG. 7, the devices are still air isolated and dielectrically isolated from each other. Such devices will have a minimum of parasitics because of the very low junction capacitances. The structure is such that the capacitance associated with the junctions is essentially only the capacitance on the sides of the diffusion regions which will only be the thickness of the very thin semiconductor body 11. There is substantially no junction capacitance between the diffused regions 16 and 18 and the insulating layer 12 because the insulating layer 12 is formed of a very good insulator.

Figure 8:
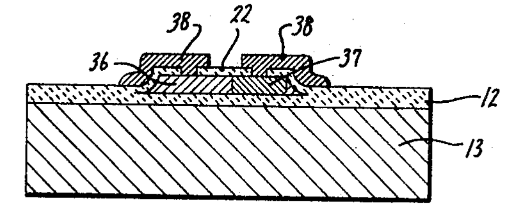
FIG. 8 is a cross-sectional view of a diode made in accordance with the present invention.

In FIG. 8 there is shown a diode semiconductor structure constructed in accordance with the present invention in which two regions 36 and 37 of opposite polarity, such as an N-type region 36 and a P-type region 37, have been provided in the semiconductor body 11. An insulating layer 22 is formed over the same and a lead structure 38 is provided to make contact to the two separate regions to provide a diode which has a very low junction capacitance by virtue of the fact that the bottom of the diode is in contact with the insulating layer 12. Thus, the capacitance of the junction will only be the thickness of the layer 11 which, as pointed out, can be on the order of 2 to 3 microns.

Figure 9:
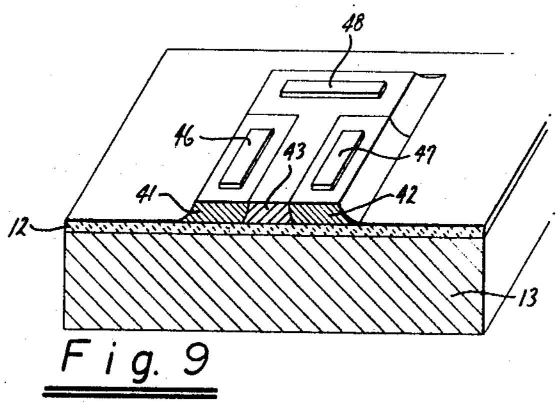
FIG. 9 is a cross-sectional isometric view of a lateral transistor incorporating the present invention.

In FIG. 9, there is shown a lateral P-N-P transistor formed in accordance with the present invention by diffusing into the semiconductor body 11 two P-type regions 41 and 42 which extend down to the insulating layer 12 and which are spaced apart a predetermined distance. An N-type T-shaped region 43 is provided between the same which also extends down to the insulating layer 12. A collector contact 46 is provided on the region 41; an emitter contact 47 is provided on the region 42; and a base contact 48 is provided on the region 43. Additional metallization or leads (not shown) can be provided for making contact to the contacts 46, 47 and 48. A lateral transistor, such as that shown in FIG. 9, will have an appreciably better gain than a conventional lateral P-N-P transistor because the bottom component of the junction capacitance has been substantially eliminated; therefore, there will be no loss of minority carriers which could be injected through the bottom portion.

Figure 10:
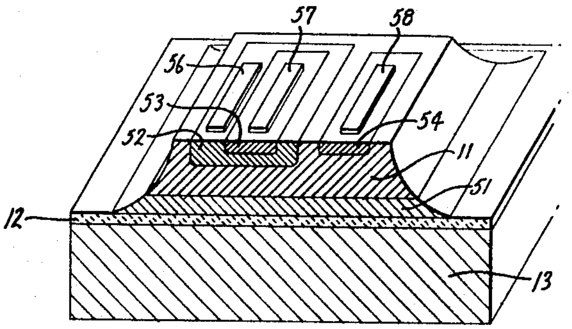
FIG. 10 is a cross-sectional isometric view of a bipolar transistor made in accordance with the present invention.

In FIG. 10, there is shown an N-P-N bipolar transistor constructed in accordance with the present invention. In this embodiment of the invention, a layer 51, which is conventionally referred to as a buried layer, is provided. As is well known to those skilled in the art, such a buried layer, which would be of the N+ type for an N-P-N type transistor, would be formed by first depositing by conventional techniques as, for example, epitaxially depositing an N+ layer onto the semiconductor body 11 before the insulating layer 12 is formed thereon. Thereafter, the insulating layer 12 is formed as well as the support structure 13. The layer 11 is then reduced to the desired thickness in the manner hereinbefore described. After this has been accomplished, the regions 52, 53 and 54 can be formed in a conventional manner by first forming an oxidizing layer over the surface 14 and thereafter, by suitable masking, diffusing and etching techniques, diffusing the desired impurities into the semiconductor body 11 to provide the regions 52, 53 and 54. It, however, should be pointed out that in view of the fact that the region 53 is formed within the region 52, it is necessary that the layer 11 have a greater thickness as, for example 5½ microns. A contact 56 is provided for the region 52 and serves as a base contact; a contact 57 makes contact to the region 53 and serves as the emitter contact; and a contact 58 on the region 54 serves as the collector contact. Again, the capacitance will be substantially reduced because the N+ layer is in direct contact with the insulating layer 12. In addition, the devices are air isolated and dielectrically isolated from each other.

I claim:

1. In a semiconductor structure, a support body, a layer of insulating material formed on the support body and having a relatively planar surface, a body of semiconductor material formed on the layer of insulating material and having a relatively precisely controlled predetermined depth ranging from approximately 2 to 5½ microns with a surface generally parallel to the surface of the layer of insulating material, and at least a pair of semiconductor devices formed in the body of semiconductor material by diffused regions forming junctions extending to said surface of said semiconductor body, said body of semiconductor material having grooves formed therein to expose the layer of insulating material to the air so that the devices are isolated from each other by the air in the grooves and by the layer of insulating material, said grooves opening through said surface of said semiconductor body and having a width at said surface of said semiconductor body which is at least as great as the width at the insulating layer.

2. A semiconductor structure as in claim 1 together with metallization carried by the semiconductor body for interconnecting said devices.

3. A semiconductor structure as in claim 1 wherein all of said diffused regions extend completely through said semiconductor body down to said layer of insulating material.

4. A semiconductor structure as in claim 1 wherein said devices are formed by each having spaced diffused source and drain regions extending downwardly through the semiconductor body to the layer of insulating material with a gate disposed between the same.

5. A semiconductor as in claim 1 wherein at least one of said devices is a diode.

6. A semiconductor structure as in claim 1 wherein at least one of said devices is a lateral transistor.

7. A semiconductor structure as in claim 1 wherein at least one of said devices is a bipolar transistor.

* * * * *